US009054642B2

(12) United States Patent
Noest et al.

(10) Patent No.: US 9,054,642 B2
(45) Date of Patent: Jun. 9, 2015

(54) SYSTEMS AND METHODS TO PROVIDE COMPENSATED FEEDBACK PHASE INFORMATION

(71) Applicant: Intel Mobile Communications GmbH, Neubiberg (DE)

(72) Inventors: Peter Noest, Munich (DE); Martin Kastner, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/677,458

(22) Filed: Nov. 15, 2012

(65) Prior Publication Data

US 2014/0133528 A1    May 15, 2014

(51) Int. Cl.
*H03C 5/00*   (2006.01)
*H04L 27/36*   (2006.01)

(52) U.S. Cl.
CPC ............... *H03C 5/00* (2013.01); *H04L 27/361* (2013.01); *H04L 27/368* (2013.01)

(58) Field of Classification Search
USPC ................ 375/295, 296, 297, 300, 302, 308
See application file for complete search history.

(56) References Cited

U.S. PATENT DOCUMENTS

| | | | |
|---|---|---|---|
| 7,483,680 B2 | 1/2009 | Sundstroem | |
| 8,198,950 B2 * | 6/2012 | Yamanouchi et al. | ........ 332/145 |
| 2008/0031383 A1 * | 2/2008 | Magoon et al. | ............... 375/300 |
| 2009/0311979 A1 | 12/2009 | Husted et al. | |

* cited by examiner

*Primary Examiner* — Kabir A Timory
(74) *Attorney, Agent, or Firm* — Eschweiler & Associates, LLC

(57) ABSTRACT

A communication system includes a polar conversion component, a polar modulator, an RF front-end component, a feedback receiver, a delay compensation component, and an adder. The polar conversion component is configured to provide an amplitude signal and a phase signal. The polar modulator is configured to receive amplitude signal and the phase signal and to provide the phase modulated local oscillator signal and an RF output signal. The RF front-end component is configured to receive the RF output signal and to provide a coupled output signal. The feedback receiver is configured to receive the phase modulated local oscillator signal and the coupled output signal and to generate an uncompensated feedback phase information signal. The delay compensation component is configured to receive the phase signal and the uncompensated feedback phase information signal and to generate a compensation signal. The adder is configured to add the compensation signal to the uncompensated feedback phase information signal to generate a compensated feedback phase information signal.

17 Claims, 9 Drawing Sheets

```
        filterorder=1 for m=0:filterorder
            for k=0:filterorder
                if k~=m
                    M1(k+1)=(Delay-k)/(m-k);
                else
                    M1(k+1)=1;
                end end
            b(m+1)=prod(M1);
            clear M1;
600         end
```

FIG. 6

```
    if ((phase(i1)-phase(i1-1))>1.5*pi)
            buffer=(phase(i1-1)+2*pi);
        elseif((phase(i1)-phase(i1-1))<-1.5*pi)
            buffer=(phase(i1-1)-2*pi);
        else
            buffer=phase(i1-1);
        end delayed_phase(i1)=phase(i1)*b(1)+buffer*b(2);
```

SYSTEMS AND METHODS TO PROVIDE COMPENSATED FEEDBACK PHASE INFORMATION

BACKGROUND

Traditional designs of RF-modulator in wireless communication systems like LTE, HSPA, Bluetooth, WLAN, GSM-EDGE, and the like, employ vector modulator architectures which operate essentially as a single-sideband up-converter (SSB) using two digital-to-analog converters (DAC), two mixers and a power amplifier (PA). A different concept, the polar modulator concept separates the modulation signal into an amplitude modulation (AM) signal and a phase modulation (PM) signal. The symbols or points used in polar modulation correspond or translate from Cartesian coordinates utilized in vector modulation concepts. An additional feedback receiver (FBR) connected to the output of the transmitter can be useful for output power control, digital pre-distortion (DPD) and impedance matching. The usage of the phase modulated local oscillator (LO) signal also for the down conversion in the feedback receiver can utilize the measurements of the output amplitude and the phase shift of the PA.

BRIEF DESCRIPTION OF THE DRAWINGS

FIG. 6 is an example of Matlab code that can be utilized to generate the Lagrange filter coefficients FIG. 7 is an example of Matlab code that can be utilized to Lagrange phase delay filtering

DETAILED DESCRIPTION

Figure 1:
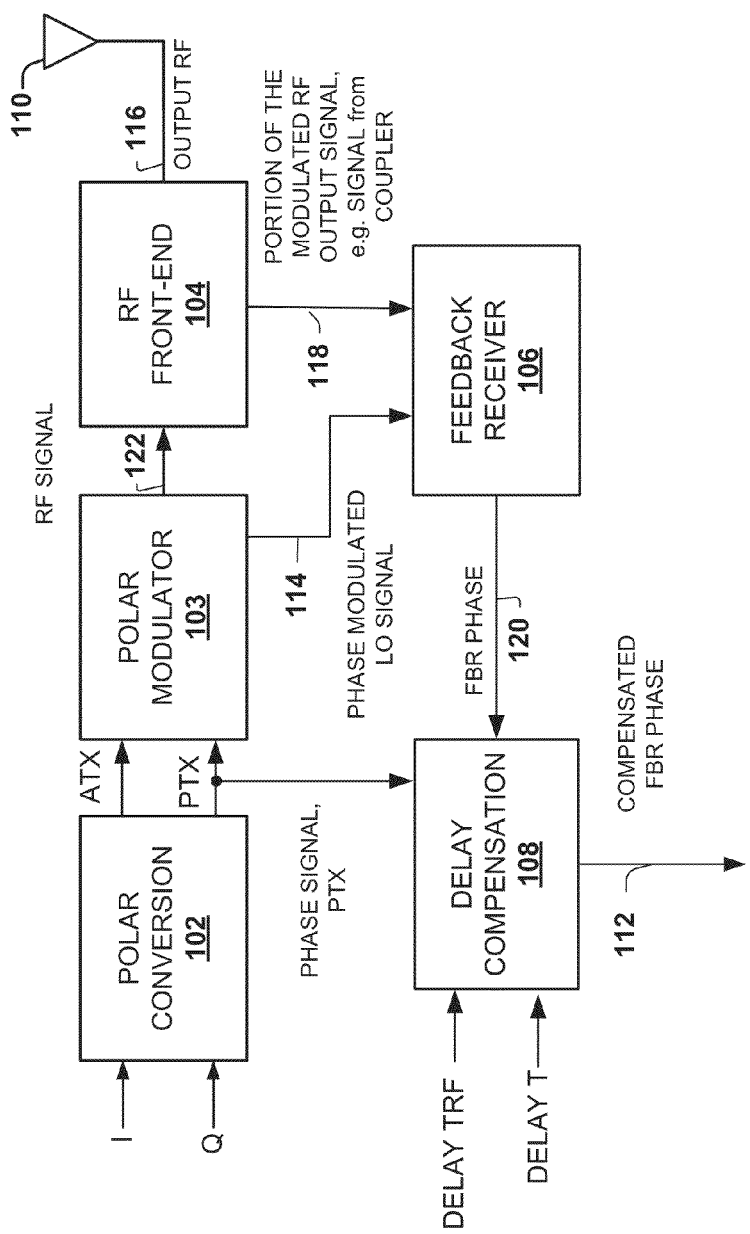
FIG. 1 is a simplified diagram illustrating a communication system 100 employing polar modulation.

The present invention will now be described with reference to the attached drawing figures, wherein like reference numerals are used to refer to like elements throughout, and wherein the illustrated structures and devices are not necessarily drawn to scale.

FIG. 1 is a simplified diagram illustrating a communication system 100 employing polar modulation that measures phase shift with enhanced accuracy. The phase shift is measured and compensated as described below. The compensated phase measurement can be utilized for a variety of applications including, but not limited to adaptive digital pre-distortion, antenna tuner, amplifier tuner, and the like. Further, the compensated phase measurement can be utilized for applications not related to communications.

The system 100 is described primarily towards transmission, however, it is appreciated the system 100 can also be utilized for receiving. Further, the system 100 is provided in a simplified form in order to facilitate understanding. It is appreciated that variations, such as additional or varied components are contemplated.

The communication system 100 uses amplitude modulation and phase modulation to generate an output RF signal for transmission. Phase shift(s) can be introduced to the output RF signal by portions of the communication system 100, such as the portions used for transmission. One type of phase shift is amplitude modulation to phase modulation (AM/PM) distortion. AM/PM distortion can be introduced by a power amplifier a path of the system 100. Phase shift(s) can be independent of amplitude modulation, such as phase variations depending on the matching of a power amplifier.

The phase shifts can be accounted for if accurately measured or detected. One technique to detect these phase shifts is to use a feedback receiver to generate feedback information. The feedback information includes phase information and amplitude information and is derived at least partially from a coupled version of the output RF signal. The feedback information can then be utilized by the communication system to compensate for the detected phase shifts and enhance signal quality.

However, differences in path delays between the coupled output signal and other signals utilized in to generate the feedback information are typically present. These delay differences, even when small, diminish the accuracy and usefulness of feedback information, specifically when using a phase modulated LO to generate the feedback phase information. For example, the feedback information may be insufficient to allow sufficient accuracy of the phase shifts measurement. As a result, a selected or desired signal quality may not be attainable.

The system 100 identifies the delay differences in path delays and compensates the feedback information from the feedback receiver by accounting for path delays. The compensated feedback information more closely or accurately represents phase shifts present in the RF output signal. Thus, the phase shifts can be measured accurately by removing or accounting for the impact of the unwanted path delay.

The system 100 includes a polar conversion component 102, a polar modulator 103, an RF front end 104, a feedback receiver 106, and a delay compensation component 108. The polar conversion component 102 and the polar modulator 103 can be considered part of a transmission path. The system 100 is configurable to provide a modulated RF output signal to an antenna 110 and generates a compensated feedback receiver (FBR) phase information signal 112.

The polar conversion component 102 receives an input signal and provides polar modulation components, which are provided to the polar modulator 103. The polar modulator 103 generates a modulated RF signal that can be used for transmission. The input signal is a baseband signal that has been modulated from a data signal, in digital form. The input signal, in this example, includes in-phase (I) and quadrature-phase (Q) symbols. The symbol components are also referred to as Cartesian symbol components. As stated above, the polar conversion component 102 converts the I/O vector modulation components into polar modulation components. The Cartesian symbol components are converted into amplitude modulation (AM) symbol components (A) and phase modulation (PM) symbol component (φ or P), also referred to as polar components.

The polar components are converted to analog signals by the polar modulator 103 and provided as the modulated or RF signal for transmission. A digital to analog converter can be used to convert the "A" components into an analog amplitude modulation signal and a DPLL is used to convert the "P" components into an analog modulation signal. The analog signals are combined and provided as the modulated RF signal 122. The polar modulator 103 also provides a portion of the phase modulated signal as a phase modulated local oscillator (LO) signal 114. The phase modulated LO signal is a local oscillator signal modulated with the phase information of the analog phase modulation signal. The polar modulator 103 has an associated delay, referred to as a phase delay ($T_{TX}$).

The RF front end 104 generally amplifies and filters the modulated RF signal to facilitate transmission of the signal. The RF front end 104 provides the amplified and filtered signal as an output signal 116, which can then be transmitted via an antenna. The RF front end 104 also provides a coupled version 118 of the output signal. The output signal has an associated propagation delay, referred to as a second RF path delay and is denoted as $T_{RF2}$.

The RF front end 104 can introduce phase shifts into the output signal. One type of the phase shift is AM/PM distortions, described above. The AM/PM distortions can be introduced, for example, by a power amplifier within the RF path. These phase shifts, including the AM/PM distortions, are present in the coupled version of the output signal.

The feedback receiver 106 receives the coupled version 118 of the output signal and the phase modulated local oscillator signal 114. The phase modulated local oscillator signal also has an associated propagation delay, referred to as a first RF path delay and is denoted as $T_{RF1}$. The first RF path delay is the propagation time from the polar modulator 103 to the feedback receiver 106.

The feedback receiver 106 extracts phase and magnitude information from the signal 118 using the phase modulated local oscillator signal 114 to generate feedback information. The feedback information includes FBR phase information and amplitude information. The feedback information generated by the feedback receiver 106 can facilitate or be part of a linearization mechanism to extract an error signal comprising phase shift(s), such as phase and magnitude distortion, which can be utilized to pre-distort the modulated RF signal. The feedback receiver 106, in this example, provides phase information in the form of a feedback receiver (FBR) phase information signal 120.

In one example, the feedback receiver 106 demodulates the coupled output signal 118 using the phase modulated local oscillator signal 114. The demodulated signals are filtered and converted to digital signals. At least a portion of the digital signals comprise the FBR phase signal. Further, there is also a propagation delay along the path of the feedback receiver 106, referred to as a feedback receiver path delay, which is denoted as $T_{FBR}$.

However, delay difference between the first RF path delay and the second RF path delay results in unwanted FBR phase signal variations and can degrade the overall signal quality dramatically. The delay difference between the first RF path delay and the second RF path delay is referred to as RF delay and denoted as $T_{RF}$.

The delay compensation component 108 receives the FBR phase information signal 120 and generates a compensated FBR phase information signal 112. The compensated signal 112 provides a measurement of phase shift(s) with enhanced accuracy because the delay compensation component 108 compensates for the RF delay differences.

Figure 2:
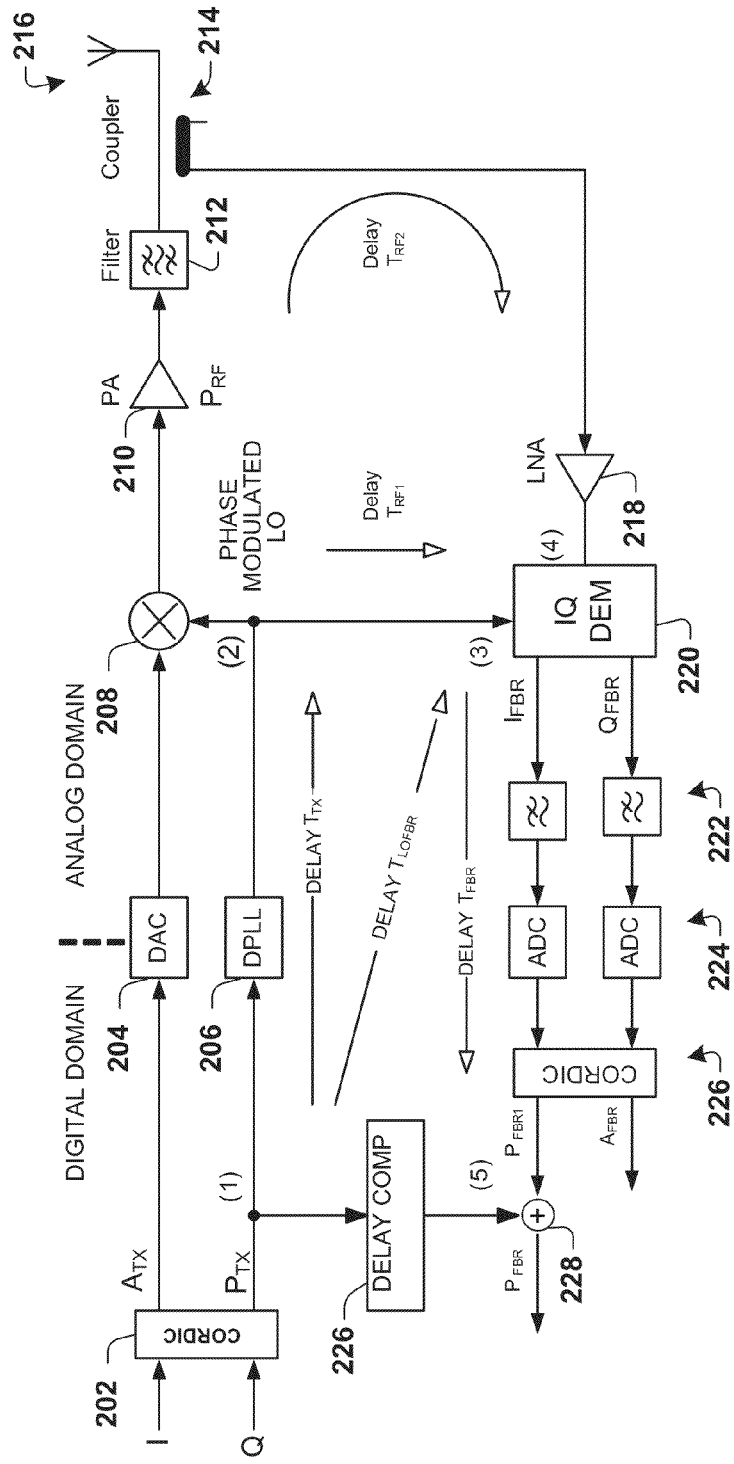
FIG. 2 is a diagram illustrating a communication system employing polar modulation.

FIG. 2 is a diagram illustrating a more detailed communication system 200 employing polar modulation. The system 200 measures phase shift(s) with enhanced accuracy by accounting for delay differences along paths of the system 200.

For illustrative purposes, the system 200 is described with regards to transmission. It is appreciated that suitable variations in the system 200 are contemplated. Further, it is also appreciated that other suitable applications for the compensated phase information signal are also contemplated.

The system 200 includes a CORDIC 202 that receives Cartesian symbol components including in-phase (I) and quadrature-phase (Q) symbols. The CORDIC 202, converts the Cartesian symbol components into polar components, which comprise amplitude modulation (AM) symbol components (ADO and phase modulation (PM) symbol components ($\phi$ or $P_{TX}$).

The amplitude modulation components are provided to a digital to analog converter 204, which generates an analog amplitude signal. The phase modulation components are provided to a DPLL 206, which generates an analog phase signal using a local oscillator (LO) signal. The analog amplitude signal and the analog phase signal are combined by a mixer 208 to generate a modulated RF signal. The modulated RF signal is shown at (2) in FIG. 2 and is provided by:

$$V_{MIXout}(t)=A_{TX}(t-\tau_{TX})\cos(\omega_0 t+\phi_{TX}(t-\tau_{TX}))$$

Where $A_{TX}$ represents the analog amplitude signal
$\omega_0$ is the carrier angular frequency
$\phi_{TX}$ represents the analog phase signal
$\tau_{TX}$ represents a polar modulator phase delay from node (1) to node (2).

The phase of the LO signal is described by:

$$\phi_{Lo}(t)=\omega_0 t+\phi_{TX}(t-\tau_{TX})$$

A power amplifier 210 amplifies the modulated RF signal, which is then filtered by filter 212. The power amplifier 210 introduces phase versus amplitude non-linearity and results in amplitude modulation to phase modulation (AM/PM) conversion. Thus, an output signal of the power amplifier 210 is provided by (delay of PA is considered as negligible):

$$V_{PA}(t)=A_{TX}(t-\tau_{TX})\cos(\phi_0 t+\phi_{TX}(t-\tau_{TX})+\phi_{RF})$$

The output of the filter 212 is an output RF signal, which can be transmitted by antenna 216. A coupler 214 is present and obtains a coupled version of the output signal.

A low noise amplifier 218 receives the coupled output signal and provides the amplifier signal (4) to a demodulator 220. The demodulator 220 is a quadrature demodulator and demodulates an input signal into I and Q components. The amplifier signal (4) is an input signal for the demodulator 220 and is shown as:

$$V_{DEMODin}(t)=V_{PA}(t-\tau_{RF2})=A_{TX}(t-\tau_{TX}-T_{RF2})\cos(\omega_0 t-\omega_0\tau_{RF2}\Phi_{TX}(t-T_{TX}-\tau_{RF2})+\phi_{RF})$$

Where $\tau_{RF2}$ is a second RF delay, which represents a delay from the power amplifier 210 along through the low noise amplifier 218 to (4) in FIG. 2.

The phase modulated LO signal from (2) is also provided as an input at (3) to the demodulator 220. The phase modulated LO signal is given by:

$$\phi_{LO}(t-\tau_{RF1})=\omega_0 t-\omega_0\tau_{RF1}+\phi_{TX}(t-\tau_{TX}-\tau_{RF1})$$

Where $\tau_{RF1}$ is a first RF delay, which represents a delay from the mixer 208 at (2) to the demodulator 220 at (3) of FIG. 2.

The demodulator 220 using the phase modulated LO signal to demodulate the amplifier signal into the I and Q components. The I and Q components are filtered by filters 220 and converted to digital I/O signals at analog to digital converters 224. A second CORDIC 226 converts the digital I and Q signals into polar components $A_{FBR}$ and $P_{FBR}$, which represent FBR amplitude components/signals and FBR phase information/signals for a feedback receiver. The FBR phase information/signal is represented by:

$$\phi_{FBR1}(t) = -\omega_0 \tau_{RF} + \phi_{TX}(t-\tau-\tau_{RF}) - \phi_{TX}(t-\tau) + \phi_{RF}$$

Where delay $T_{RF}$ is given by:

$$\tau_{RF} = \tau_{RF2} - \tau_{RF1}$$

As the delay difference from the first RF path delay and the second RF path delay. A total or complete roundtrip delay from (1) to (5) of FIG. 2 is given by:

$$\tau = \tau_{TX} + \tau_{FBR} + \tau_{RF1}$$

A phase delay from the polar modulator to the feedback receiver LO input is represented by $$\tau_{LOFBR} = \tau_{TX} + \tau_{RF1}$$

Thus, the total or complete roundtrip delay from (1) to (5) of FIG. 2 can also be given by:

$$\tau = \tau_{FBR} + \tau_{LOFBR}$$

The FBR phase information is summed with a compensation signal by adder 228 to provide compensated FBR phase information. The compensation signal is provided by a delay compensation component 226.

In the ideal case, the delay $T_{RF}$ is zero, which means that the first RF path delay is equal to the second RF path delay. This equation is shown as:

$$\tau_{RF} = \tau_{RF2} - \tau_{RF1} = 0;$$

because $\tau_{RF2} = \tau_{RF1}$

Figure 3A:
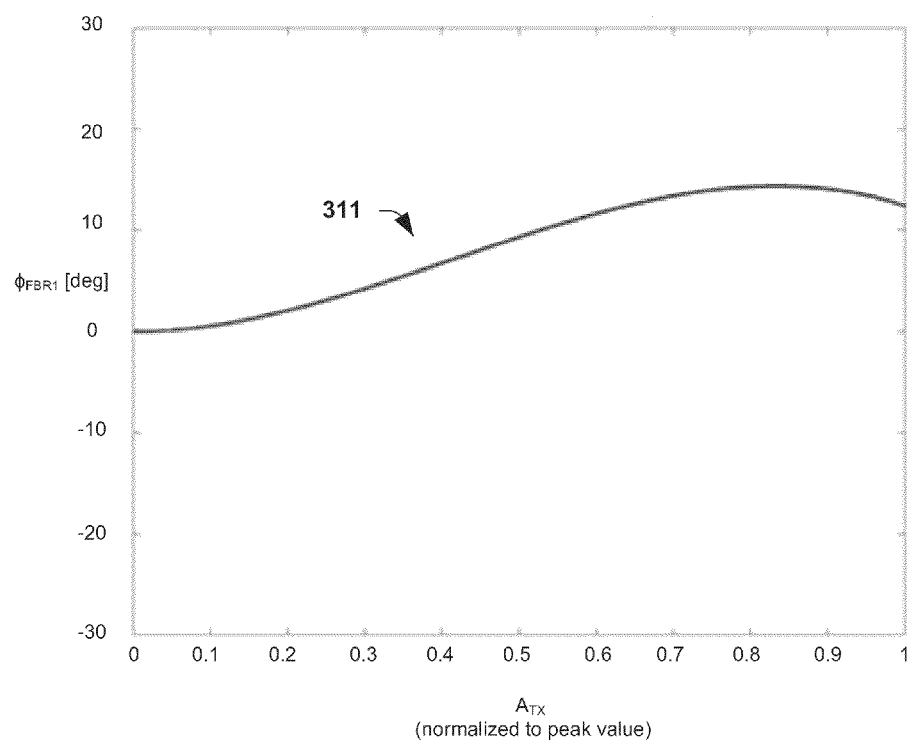
FIG. 3A is a graph illustrating the FBR phase information from a feedback receiver with phase modulated LO for the ideal case where the RF delay $T_{RF}$ is zero.

FIG. 3A is a graph 301 illustrating the FBR phase information from a feedback receiver for the ideal case with a PA having AMPM conversion where the delay $T_{RF}$ is zero. Here, the first RF path delay is equal to the second RF path delay such that their difference is zero. The FBR phase information is relative the amplitude component.

An x-axis yields values of the amplitude component $A_{TX}(t)$ and a y-axis provides values of the phase modulation signal $\phi_{FBR1}(t)$ from the feedback receiver in degrees. Both are from the digital domain and the comparison provides amplitude modulation/phase modulation characteristics of the power amplifier 210.

In the ideal case, the delay $T_{RF}$ is zero and there is ideal time alignment between $A_{FBR}(t)$ and $A_{TX}(t)$. As a result, the FBR phase information from the feedback receiver for the ideal case is given by:

$$\phi_{FBR1}(t) = \phi_{RF}$$

Line 311 provides the comparison of the amplitude component and the phase modulation signal. There is no difference between the first RF path delay and the second RF path delay. The AM/PM characteristic is stable as shown in the line 311. Thus, the signals from the feedback receiver can be utilized to facilitate signal generation.

However it is understood that in real world situations there will, necessarily, be a delay difference. These differences can lead to phase variations in the AM/PM characteristics provided by the feedback receiver.

Figure 3B:
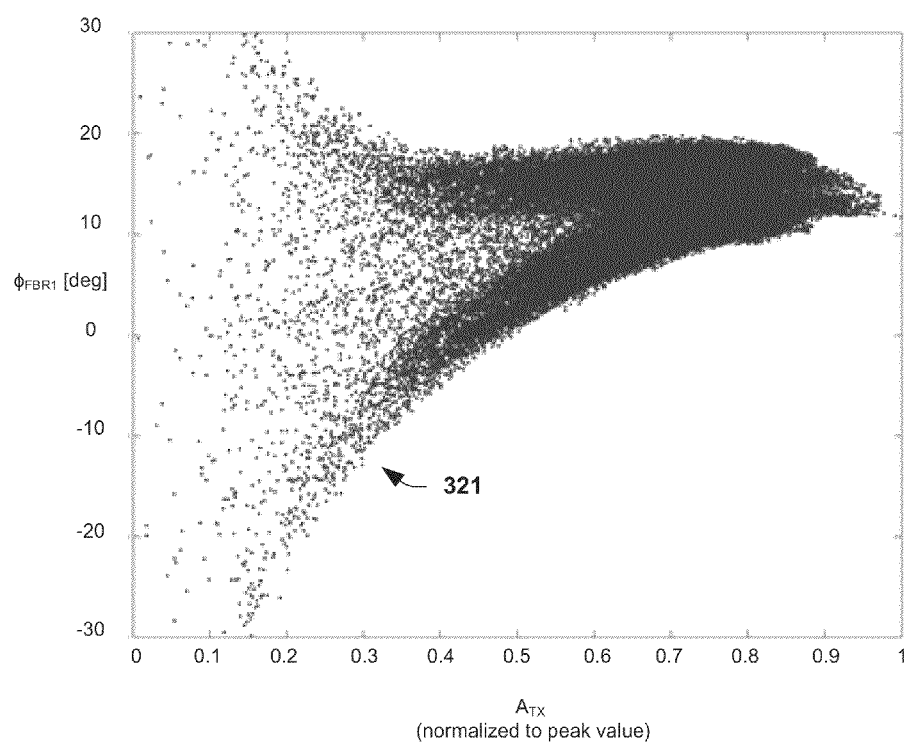
FIG. 3B a graph illustrating the FBR phase information from a feedback receiver with phase modulated LO for the case where the RF delay $T_{RF}$ is present.

FIG. 3B is a graph 302 illustrating the FBR phase information from a feedback receiver for the normal case where the delay is present. Here, the first RF path delay is not equal to the second RF path delay. The FBR phase information is relative the amplitude component.

An x-axis yields values of the amplitude component $A_{TX}(t)$ and a y-axis provides values of the FBR phase information $\phi_{FBR1}(t)$ from the feedback receiver in degrees. Both are from the digital domain and the comparison provides amplitude modulation/phase modulation characteristics of the power amplifier 210.

Here, the delay $T_{RF}$ is different from zero. The FBR phase information is disrupted by the phase difference of the phase modulated FBR LO and the phase of the RF signal due to RF delay. Thus, the FBR phase information is given by:

$\phi_{RF}$ and it is disrupted by $$\phi_{TX}(t-\tau-\tau_{RF}) - \phi_{TX}(t-\tau)$$

Line 321 provides the comparison of the amplitude component and the FBR phase information for the normal case. The line 321 represents an example with a UMTS Rel. 99 signal having a symbol rate of 3.84 MSps and a delay $T_{RF}$ of 10 ns. It can be seen from line 321 that even a relatively small delay can result in a large amount of distortion or variation in the FBR phase information. This reduces signal quality dramatically.

As stated above, the system 200 adds a compensation signal to the FBR phase information/signal via the adder 228. The adder 228 provides the compensated FBR phase information. The compensated FBR phase information mitigates reduction in signal quality, such as that seen in FIG. 3B. The compensation signal is generated by the delay compensation component.

Figure 3C:
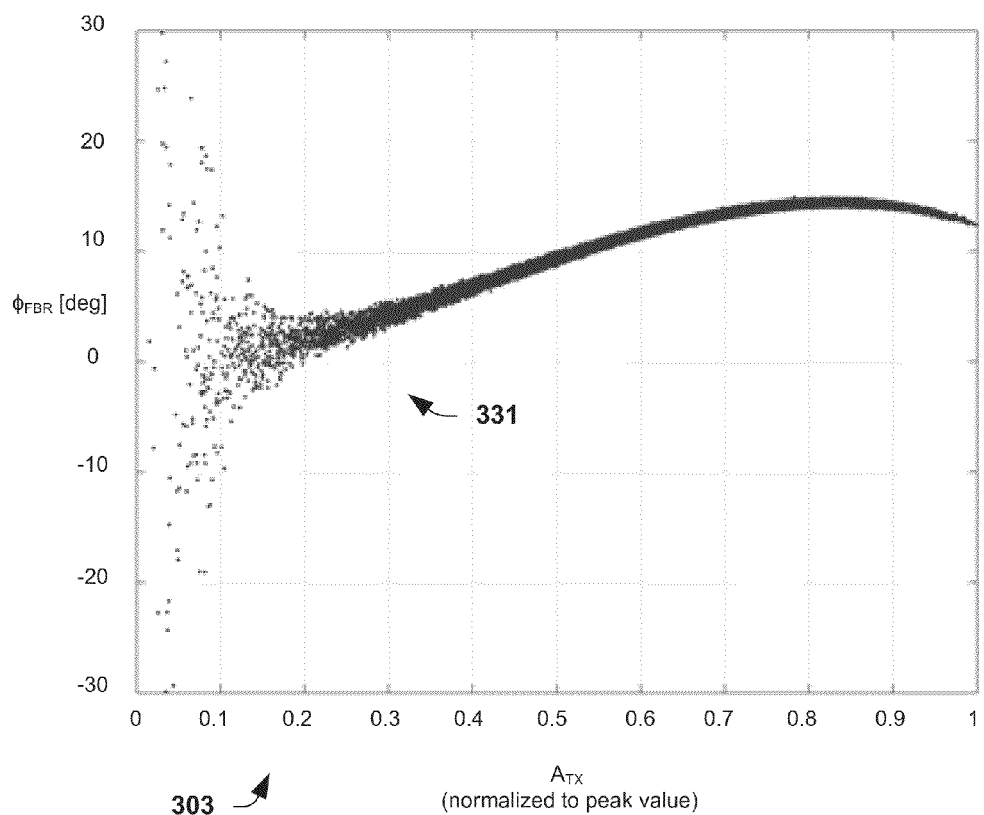
FIG. 3C is a graph illustrating the case FIG. 3B but with applied delay compensation.

FIG. 3C is a graph 303 illustrating the compensated FBR phase information from a feedback receiver for the normal case. Here again, the first RF path delay is not equal to the second RF path delay. The FBR phase information is presented relative the amplitude component.

An x-axis yields values of the amplitude component $A_{TX}(t)$ and a y-axis provides values of the compensated FBR phase information $\phi_{FBR1}(t)$ from the feedback receiver in degrees. Both are from the digital domain and the comparison provides amplitude modulation/phase modulation characteristics of the power amplifier 210.

Here again, the delay $T_{RF}$ is different from zero. The FBR phase information is disrupted by the phase variations. Thus, (uncompensated) the FBR phase information is given by:

$\phi_{RF}$ and it is disrupted by $$\phi_{TX}(t-\tau-\tau_{RF}) - \phi_{TX}(t-\tau)$$

The compensation signal provided by the delay compensation component 226 is obtained by:

$$\phi_{TX}(t-\tau) - \phi_{TX}(t-\tau-\tau_{RF})$$

The compensation signal is added to the FBR phase information from the FBR by the adder 226 to obtain the compensated FBR phase information signal given by:

$$\phi_{FBR}(t) = \phi_{FBR1}(t) + \phi_{TX}(t-\tau) - \phi_{TX}(t-\tau-\tau_{RF}) = -\omega_0 \tau_{RF} + \phi_{RF}$$

Where $\phi_{FBR}(t)$ is the compensated FBR phase information. The remaining term $-\omega_0 \tau_{RF}$ can be removed by calibration.

Line 331 provides a comparison of the FBR amplitude component/information and the compensated FBR phase information for the normal case. The applied compensation can be seen by comparing line 331 with line 321 of FIG. 3B. Here, the examples is similar to that used in FIG. 3B with a UMTS Rel. 99 signal having a symbol rate of 3.84 MSps and a delay $T_{RF}$ of 10 ns. However, signal quality is improved and similar to the ideal case shown in FIG. 3A.

As stated above, the system 200 adds a compensation signal to the FBR phase information/signal via the adder 228. The adder 228 provides the compensated FBR phase information. The compensated FBR phase information mitigates reduction in signal quality, such as that seen in FIG. 3B. The compensation signal is generated by the delay compensation component 226.

The delay compensation component 226 obtains and analyzes the propagation delays present in the system 200 in order to generate the compensation signal. In one example, the delay compensation component 226 uses a two delay filter to generate the compensation signal. A first filter compensates for a roundtrip delay and a second filter compensates for the RF delay. Additional details of an example delay compensation component are provided below.

Figure 4:
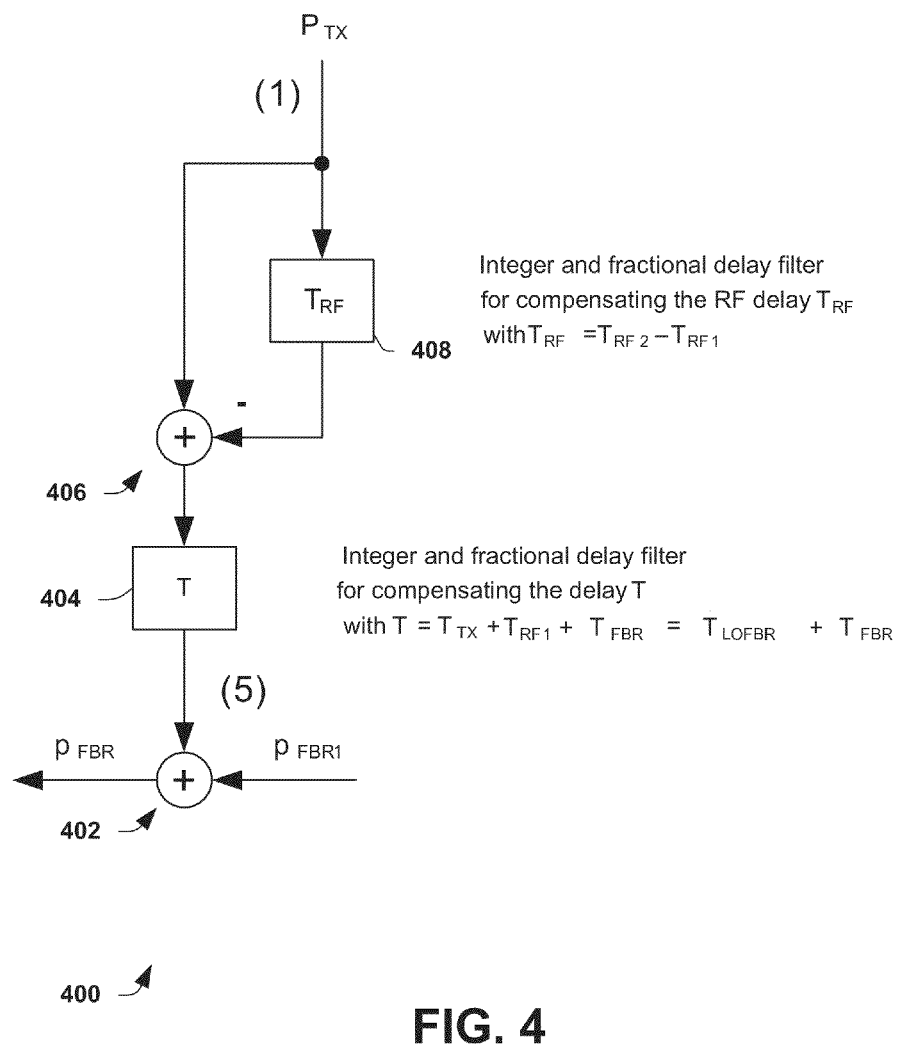
FIG. 4 is a diagram illustrating a delay compensation component for applications in polar communication systems.

FIG. 4 is a diagram illustrating a delay compensation component 400 for applications in communication systems. The delay compensation component 400 facilitates generation of a compensated FBR phase information signal that enhances signal quality by compensating for delay differences in RF path propagations and path delays.

The delay compensation component 400 provides a compensation signal to an adder 402 at (5). The adder 402 corresponds to the adder 228 of FIG. 2. The adder 402 adds a FBR phase information with the compensation signal to generate the compensated FBR phase information signal.

The delay compensation component 400 includes an RF delay filter 408, a filter adder 406, and a roundtrip delay filter 404. Both filters operate in the digital domain. A phase symbol component is provided at (1), which corresponds to the similar denoted location in FIG. 2. The phase symbol component is provided to the RF delay filter 408.

The RF delay filter 408 filters the phase symbol component according to the difference between the first RF path delay and the second RF path delay, described above. The RF delay filter 408 is an integer and fractional delay filter. The filtered component is subtracted from the phase symbol component by the RF adder 406. The resulting component is provided as an input to the roundtrip delay filter 404. The resulting component is filtered according to the roundtrip delay to generate the compensation signal. The roundtrip delay filter 404 is also an integer and fractional delay filter.

Figure 5:
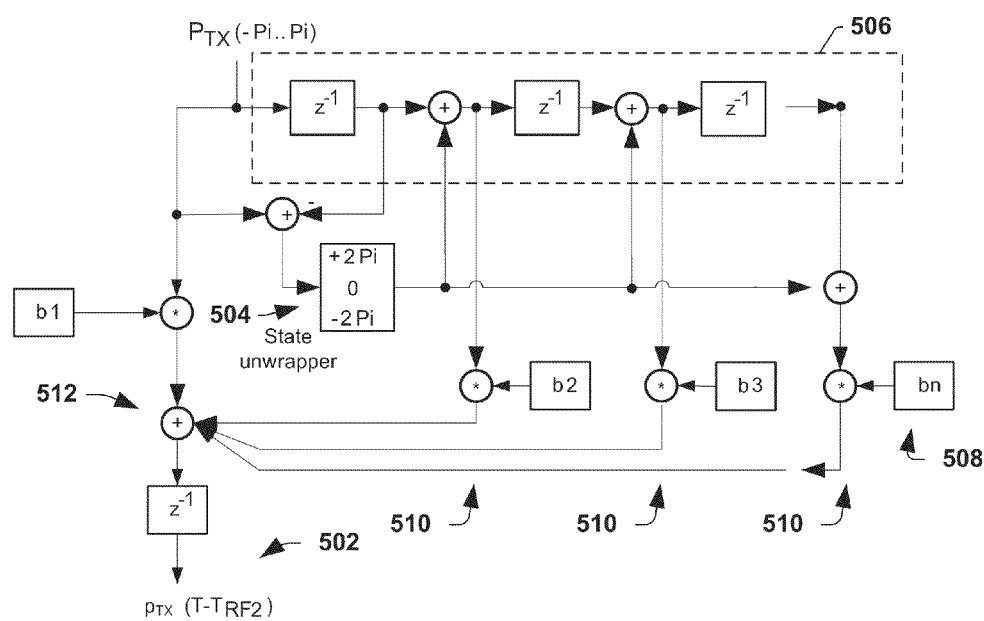
FIG. 5 is a diagram illustrating a fractional phase delay filter.

FIG. 5 is a diagram illustrating a fractional phase delay filter 500. The filter 500 is provided as an example for a fractional phase delay filter, using state unwrapping for the phase discontinuity problem at +Pi, −Pi.

The filter includes a state unwrapper 504, a delay filter chain 506, chain coefficients 508, chain multipliers 510, and an adder 512. Phase jumps are detected by the unwrapper 504 and the state of the filter is corrected, to prevent the filter from numerical artifacts resulting from the +Pi, −Pi wrap. So the whole filter behaves like a filter applied on a phase signal with an unlimited phase input range and without phase discontinuities. This filter can be of any order greater or equal to 1. Filter coefficients b2 to bn are the digital FIR filter coefficients of a standard fractional delay filter. Such filter coefficients can be calculated by using a suitable approach, such as the Lagrange fractional delay filter approach, shown in FIG. 6.

The filter 500 is utilized for normal operation because phase symbol components have discontinuities by wrapping it around a numeric range. The discontinuities can be handled in several ways. One way is to neglect values around discontinuities to mitigate errors by filter settling, unwrap filter states as input signal discontinuities enter the delay filter chain, or differentiate phase to frequency domain, apply delay filtering, and integrate to the phase domain to obtain the result.

FIG. 6 is an example of matlab code that can be utilized to generate the Lagrange filter coefficients b1 and b2. The code shown in FIG. 6 is one example of a suitable approach to obtain filter coefficients. It is appreciated that other suitable approaches can be utilized.

FIG. 7 is an example of matlab code that can be utilized to Lagrange phase delay filtering with two coefficients and to perform state unwrap. The code provided is an example of a suitable technique for the phase state unwrapper. It is appreciated that other suitable techniques are contemplated.

Figure 8:
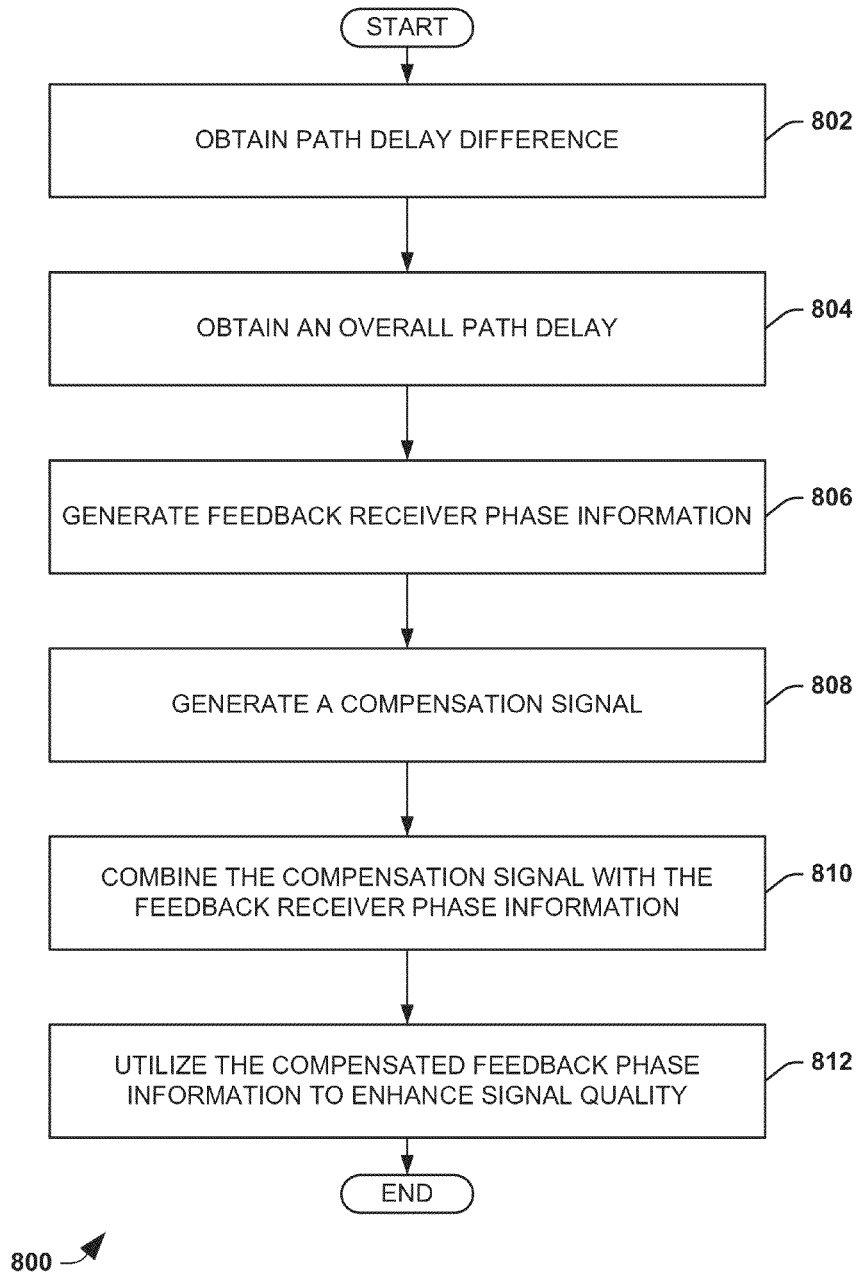
FIG. 8 is a flow diagram illustrating a method of generating phase information from a feedback receiver.

FIG. 8 is a flow diagram illustrating a method 800 of generating phase information from a feedback receiver. The phase information is obtained by considering path delays and compensating for those resulting phase variations. As a result, the phase information from the feedback receiver can be utilized to enhance transmission signal quality The method begins at block 802, wherein a path delay difference is obtained. The path delay difference is the difference between a path delay for a coupled output signal and a path delay for a phase modulated local oscillator signal.

A roundtrip delay is obtained at block 804. The roundtrip delay includes a polar modulator phase delay, a first RF path delay, and a feedback receiver path delay. The above description, including the description of FIG. 2, can be referenced for a description of the various delays involved.

A feedback receiver generates an FBR phase information signal from the coupled output signal and the phase modulated local oscillator signal at block 806. The feedback receiver typically generates feedback information, which includes the FBR phase information and additionally includes FBR amplitude information.

A compensation signal is generated at block 808 according to the path delay difference and the roundtrip delay to remove phase variations. A delay compensation component utilizing filters can be utilized to generate the compensation signal. In one example, phase symbol components are filtered with the delays to generate the compensation signal.

In another example, an integer and fractional delay filter is utilized to generate the compensation signal. The fractional portion can be realized, for example, by using Lagrange interpolation, an all pass filter, a sinc interpolation filter, and the like.

The compensation signal is combined with the FBR phase information at block 810 to generate a compensated FBR phase information signal. The compensation signal compensates for the phase variations present in the communication system.

While the methods provided herein are illustrated and described below as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIG. 2, 3, etc., are non-limiting examples of circuits that may be used to implement method(s) and/or variations thereof). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A communication system includes a polar conversion component, a polar modulator, an RF front-end component, a feedback receiver, a delay compensation component, and an adder. The polar conversion component is configured to provide an amplitude signal and a phase signal. The polar modulator is configured to receive amplitude signal and the phase signal and to provide the phase modulated local oscillator signal and an RF output signal. The RF front-end component is configured to receive the RF output signal and to provide a coupled output signal. The feedback receiver is configured to receive the phase modulated local oscillator signal and the coupled output signal and to generate an uncompensated feedback phase information signal. The delay compensation component is configured to receive the phase signal and the uncompensated feedback phase information signal and to generate a compensation signal. The adder is configured to add the compensation signal to the uncompensated feedback phase information signal to generate a compensated feedback phase information signal.

A delay compensation component includes a first filter, an adder, and a second filter. The first filter is configured to filter a phase symbol component according to first delay elements to generate a first filter output. The adder is configured to subtract the first filter output from the phase symbol component to generate an adder output. The second filter is configured to filter the adder output according to second delay elements to generate a second filter output.

A method of operating a communication system is disclosed. A path delay difference for first and second signals is obtained. A roundtrip delay for the system is obtained. A compensation signal is generated according to the RF path delay difference and the roundtrip delay. The compensation signal is combined with the phase information signal to generate a compensated phase information signal.

Although the invention has been illustrated and described with respect to one or more implementations, alterations and/or modifications may be made to the illustrated examples without departing from the spirit and scope of the appended claims. For example, although the transmission circuit described herein has been illustrated as a transmitter circuit, one of ordinary skill in the art will appreciate that the invention provided herein may be applied to transceiver circuits as well. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A communications system comprising:
a polar conversion component configured to provide an amplitude signal and a phase signal;
a polar modulator configured to receive the amplitude signal and the phase signal and to provide a phase modulated local oscillator signal and an RF output signal;
an RF front-end component configured to receive the RF output signal and to provide a coupled output signal;
a feedback receiver configured to receive the phase modulated local oscillator signal and the coupled output signal and to generate an uncompensated feedback phase information signal;
a delay compensation component configured to receive the phase signal from the polar conversion component, to receive the uncompensated feedback phase information signal from the feedback receiver, to utilize an RF delay and a roundtrip delay, and to generate a compensation signal based on the uncompensated feedback phase information signal, the roundtrip delay and the RF delay, wherein the RF delay is at least partially based upon a path of the phase modulated local oscillator signal; and
an adder configured to add the compensation signal to the uncompensated feedback phase information signal to generate a compensated feedback phase information signal.

2. The system of claim 1, wherein the RF delay is the delay between the phase modulated local oscillator signal and the phase information of the coupled output signal.

3. The system of claim 1, wherein the roundtrip delay is a combination of a first delay and a second delay, wherein the first delay is the delay between the phase modulation signal of the feedback receiver local oscillator input signal and the phase signal from the polar conversion component and the second delay is a feedback receiver path delay.

4. The system of claim 1, wherein the delay compensation component includes a first digital filter, the first digital filter being an integer and/or fractional delay filter.

5. The system of claim 4, wherein the first filter operates according to a path delay difference, the path delay difference being a difference between the first RF path delay and the second RF path delay.

6. The system of claim 4, wherein the delay compensation component further includes a second digital filter that operates according to a roundtrip delay and receives an output of the first filter as an input.

7. The system of claim 4, wherein the delay compensation component includes a second digital filter that operates according to a roundtrip delay, wherein an output of the second digital filter is provided as an input to the first digital filter.

8. The system of claim 6, wherein the delay compensation component further includes a delay adder configured to add the output of the first filter to phase symbol components and provide the sum to the second filter as the input.

9. The system of claim 1, wherein the compensated feedback phase information signal represents phase shifts present in the RF output signal.

10. The system of claim 1, wherein the feedback receiver is configured to extract phase and amplitude information from the coupled output signal using the phase modulated local oscillator signal.

11. The system of claim 10, wherein the feedback receiver is further configured to provide the extracted phase information as the uncompensated feedback phase information signal.

12. The system of claim 1, wherein the feedback receiver is configured to demodulate the coupled output signal using the phase modulated local oscillator signal to generate the uncompensated feedback phase information signal.

13. The system of claim 1, wherein the delay compensation component is configured to generate the compensation signal based on the phase signal and the uncompensated feedback phase information signal.

14. A communications system comprising:
- a polar modulator configured to receive an amplitude signal and a phase signal and generate a modulated radio-frequency (RF) signal based on the amplitude signal and the phase signal, and generate a phase modulated local oscillator (LO) signal based on the phase signal;
- a feedback receiver configured to receive the phase modulated LO signal and an RF output signal based on the modulated RF signal and configured to demodulate the RF output signal using the phase modulated LO signal to generate an uncompensated feedback phase information signal;
- a delay compensation component configured to generate a compensation signal based on the phase signal received at the polar modulator; and
- an adder configured to add the uncompensated feedback phase information signal and the compensation signal to form a compensated feedback phase information signal;
- wherein the phase modulated LO signal has a first path delay and the RF output signal has a second path delay and the feedback receiver is configured to generate the uncompensated feedback phase information signal having a delay difference between the first path delay and the second path delay.

15. The system of claim 14, wherein the uncompensated feedback phase information signal includes phase information extracted from the RF output signal.

16. The system of claim 14, wherein the feedback receiver includes a quadrature demodulator configured to demodulate the modulated RF signal using the phase modulated LO signal into quadrature components and the feedback receiver is configured to determine the delay difference based on the quadrature components.

17. The system of claim 14, wherein the feedback receiver is configured to demodulate the RF output signal to obtain demodulated signals and to convert the demodulated signals to digital signals and wherein the uncompensated feedback phase information signal includes the digital signals.

* * * * *